(12) United States Patent
Ma et al.

(10) Patent No.: US 10,210,832 B2
(45) Date of Patent: Feb. 19, 2019

(54) DISPLAY MODULE HAVING TWO DISPLAY REGIONS RESPECTIVELY DRIVEN BY TWO DRIVE CHIPS CONNECTED WITH FLEXIBLE CIRCUIT AND LIQUID CRYSTAL DISPLAY SCREEN INCLUDING SAME

(71) Applicant: Wuhan China Star Optoelectronics Technology Co., Ltd., Wuhan, Hubei (CN)

(72) Inventors: Changwen Ma, Guangdong (CN); Chun-hung Huang, Guangdong (CN); Zhou Zhang, Guangdong (CN); Yucheng Tsai, Guangdong (CN); Pan Xu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 52 days.

(21) Appl. No.: 15/322,522

(22) PCT Filed: Nov. 15, 2016

(86) PCT No.: PCT/CN2016/105855
§ 371 (c)(1),
(2) Date: Dec. 28, 2016

(87) PCT Pub. No.: WO2018/072249
PCT Pub. Date: Apr. 26, 2018

(65) Prior Publication Data
US 2018/0211619 A1    Jul. 26, 2018

(30) Foreign Application Priority Data
Oct. 18, 2016   (CN) .......................... 2016 1 0906721

(51) Int. Cl.
*G09G 3/36*   (2006.01)
*G02F 1/1345*   (2006.01)
(Continued)

(52) U.S. Cl.
CPC ....... *G09G 3/3666* (2013.01); *G02F 1/13452* (2013.01); *G06F 3/0412* (2013.01);
(Continued)

(58) Field of Classification Search
CPC ............... G09G 3/3666; G09G 3/3696; G09G 2320/043; G02F 1/13452; G02F 1/13338;
(Continued)

(56) References Cited

U.S. PATENT DOCUMENTS 6,177,917 B1   1/2001   Koizumi et al.
9,851,597 B2 *  12/2017  Park ................. G02F 1/133512
(Continued)

FOREIGN PATENT DOCUMENTS

CN    101266371 A    9/2008
CN    202443723 U    9/2012
(Continued)

*Primary Examiner* — Kwang-Su Yang
(74) *Attorney, Agent, or Firm* — Andrew C. Cheng

(57) ABSTRACT

The present application discloses a display module comprising a flexible circuit board, a first drive chip, a second drive chip and a display panel, and the display panel comprises a first display region and a second display region which are seamlessly connected, and the first drive chip and the second drive chip are installed on the display panel, and the flexible circuit board is electrically connected to a system main board, the first drive chip and the second drive chip, and the first synchronization signal and the second synchronization signal control the first display region and the second display region to synchronously show images. The present application further publishes a liquid crystal display screen. The first drive chip and the second drive chip respectively drive (Continued)

the first display region and the second display region to synchronously output images.

9 Claims, 3 Drawing Sheets

(51) Int. Cl.
  *H05K 1/14* (2006.01)
  *G06F 3/041* (2006.01)
  *G02F 1/1333* (2006.01)
(52) U.S. Cl.
  CPC ......... *H05K 1/147* (2013.01); *G02F 1/13338* (2013.01); *G09G 3/3696* (2013.01); *G09G 2310/067* (2013.01); *G09G 2320/043* (2013.01); *H05K 2201/052* (2013.01); *H05K 2201/056* (2013.01); *H05K 2201/058* (2013.01)
(58) Field of Classification Search
  CPC .................. G06F 3/0412; H05K 1/147; H05K 2201/052; H05K 2201/056; H05K 2201/058
  See application file for complete search history.

(56) References Cited

U.S. PATENT DOCUMENTS

| | | | |
|---|---|---|---|
| 9,904,420 B2* | 2/2018 | Kim | .................. G06F 3/044 |
| 2007/0296659 A1* | 12/2007 | Kwak | ................. G02F 1/13452 |
| | | | 345/87 |
| 2009/0073154 A1 | 3/2009 | Lee | |
| 2010/0053127 A1 | 3/2010 | Takenaka | |
| 2011/0193830 A1 | 8/2011 | Cho | |
| 2013/0265072 A1* | 10/2013 | Kim | .................. G09G 3/006 |
| | | | 324/754.01 |
| 2014/0176491 A1* | 6/2014 | Zhao | .................. G06F 3/0412 |
| | | | 345/174 |
| 2015/0022744 A1 | 1/2015 | Tsai et al. | |
| 2015/0156867 A1 | 6/2015 | Kim et al. | |
| 2016/0103540 A1 | 4/2016 | Huang | |
| 2016/0198560 A1 | 7/2016 | Shin et al. | |

FOREIGN PATENT DOCUMENTS

| CN | 203102810 U | 7/2013 |
|---|---|---|
| CN | 104166262 A | 11/2014 |
| CN | 204595673 U | 8/2015 |
| CN | 105183252 A | 12/2015 |
| CN | 105590613 A | 5/2016 |
| CN | 205564250 U | 9/2016 |

* cited by examiner

DISPLAY MODULE HAVING TWO DISPLAY REGIONS RESPECTIVELY DRIVEN BY TWO DRIVE CHIPS CONNECTED WITH FLEXIBLE CIRCUIT AND LIQUID CRYSTAL DISPLAY SCREEN INCLUDING SAME

CROSS REFERENCE

This application claims the priority of Chinese Patent Application No. 201610906721.8, entitled "Display module and liquid crystal display screen", filed on Oct. 18, 2016, the disclosure of which is incorporated herein by reference in its entirety.

FIELD OF THE INVENTION

The present application relates to a display technology field, and more particularly to a display module and a liquid crystal display screen.

BACKGROUND OF THE INVENTION

The liquid crystal display has an irreplaceable position in the modern display apparatus. It has been widely used in the display apparatus of the portable mobile electronic product, such as mobile products like cell phone, digital camera, palm computer, GPRS. With the development of the time, the demands of display result of liquid crystal display becomes higher and higher. While the liquid crystal display is developed in the direction of increasing the resolution to be higher and higher, the scale of screen also becomes larger and larger. The enlargement of the screen scale and increase of the resolution make the display screen loading get larger and larger. The signal of the display panel faces the issue of increased decay speed. It is more and more difficult to keep the great display result for the large scale display screen.

In prior art, the display module utilizes the drive chip at one side of the display panel to drive the pixel charge of the display region and thus to show images. Because the scale of the display screen is larger, the decay of the charge signal in the display panel increases, which results in the unbalanced display of the pixels away from one end of the drive chip and the pixels close to the drive chip in the display region, and the charge accomplishment duration for all the pixels is longer, and the display result is poor.

SUMMARY OF THE INVENTION

Therefore, the present application provides a display module and a liquid crystal display screen to solve the issue that the decay of the charge signal in the display panel increases, which results in the inequivalent display of the pixels away from one end of the drive chip and the pixels close to the drive chip in the display region, and the charge accomplishment duration for all the pixels is longer, and the display result is poor in prior art.

A display module comprises a flexible circuit board, a first drive chip, a second drive chip and a display panel, and the display panel comprises a first display region and a second display region which are seamlessly connected, and the first drive chip and the second drive chip are installed on the display panel, and the flexible circuit board is electrically connected to a system main board, the first drive chip and the second drive chip, and the system main board sends an image signal and a first synchronization signal to the first drive chip, and the first drive chip drives the first display region to show a part of image content included in the image signal according to the first synchronization signal; the system main board sends the image signal and a second synchronization signal to the second drive chip, and the second drive chip drives the second display region to show the other part of image content included in the image signal according to the second synchronization signal, and the first synchronization signal and the second synchronization signal control the first display region and the second display region to synchronously show images.

The display module comprises a color film substrate and an array substrate which are oppositely located, and the array substrate comprises a first part and a second part which are seamlessly connected, and the first part and the color film substrate are assembled and correspondingly form the first display region, and the second part and the color film substrate are assembled and correspondingly form the second display region.

The first drive chip is installed on the first part and electrically connected to a data line and a scan line corresponding to the first display region, and the second drive chip is installed on the second part and electrically connected to the data line and the scan line corresponding to the second display region.

The flexible circuit board comprises a first flexible circuit board and a second flexible circuit board, and an input end and an output end of the first flexible circuit board are respectively connected to the system main board and the first part, and the first flexible circuit board further comprises a branch end, and an input end and an output end of the second flexible circuit board are respectively connected to the branch end and the second part.

The first flexible circuit board is bent from an edge of the first part to a side of a non display surface of the display panel, and the second flexible circuit board is bent from an edge of the second part to the side of the non display surface of the display panel.

The display module further comprises a backlight module, and the backlight module is located at the side of the non display surface of the display panel and provides a backlight source to the display panel.

A liquid crystal display screen comprises a display module, and the display module comprises a flexible circuit board, a first drive chip, a second drive chip and a display panel, and the display panel comprises a first display region and a second display region which are seamlessly connected, and the first drive chip and the second drive chip are installed on the display panel, and the flexible circuit board is electrically connected to a system main board, the first drive chip and the second drive chip, and the system main board sends an image signal and a first synchronization signal to the first drive chip, and the first drive chip drives the first display region to show a part of image content included in the image signal according to the first synchronization signal; the system main board sends the image signal and a second synchronization signal to the second drive chip, and the second drive chip drives the second display region to show the other part of image content included in the image signal according to the second synchronization signal, and the first synchronization signal and the second synchronization signal control the first display region and the second display region to synchronously show images.

The display module comprises a color film substrate and an array substrate which are oppositely located, and the array substrate comprises a first part and a second part which are seamlessly connected, and the first part and the color film substrate are assembled and correspondingly form the first display region, and the second part and the color film substrate are assembled and correspondingly form the second display region.

The first drive chip is installed on the first part and electrically connected to a data line and a scan line corresponding to the first display region, and the second drive chip is installed on the second part and electrically connected to the data line and the scan line corresponding to the second display region.

The flexible circuit board comprises a first flexible circuit board and a second flexible circuit board, and an input end and an output end of the first flexible circuit board are respectively connected to the system main board and the first part, and the first flexible circuit board further comprises a branch end, and an input end and an output end of the second flexible circuit board are respectively connected to the branch end and the second part.

The first flexible circuit board is bent from an edge of the first part to a side of a non display surface of the display panel, and the second flexible circuit board is bent from an edge of the second part to the side of the non display surface of the display panel.

The display module further comprises a backlight module, and the backlight module is located at the side of the non display surface of the display panel and provides a backlight source to the display panel.

The liquid crystal display screen further comprises a sensing unit, and the sensing unit is embedded in a liquid crystal display pixel unit of the display panel and employed to receive an electrical signal generated due to that a user touches the liquid crystal display screen.

The sensing unit comprises a plurality of first sensing units and a plurality of second sensing units, and the first sensing units are in array arrangement in the first display region, and the second sensing units are in array arrangement in the second display region.

The first drive chip is electrically connected to the first sensing units and processes the electrical signal transmitted by the first sensing unit, and the second drive chip is electrically connected to the second sensing units and processes the electrical signal transmitted by the second sensing unit.

The benefits of the present application are: the first drive chip and the second drive chip respectively drive the first display region and the second display region to synchronously output images. Namely, the first drive chip and the second drive chip are utilized to synchronously control the charge to the respective pixel electrodes to ensure the high resolution of the liquid crystal display, and meanwhile, the time of pixel charge is reduced by half, and the synchronous drive of the first drive chip and the second drive chip reduces the loading of the single drive chip to solve the issue of faster charge signal decay and to promote the display result of the large scale display.

BRIEF DESCRIPTION OF THE DRAWINGS

In order to more clearly explain the technical solution in the embodiments of the present invention, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained, should all be considered within the scope of protection of the present application.

Figure 1:
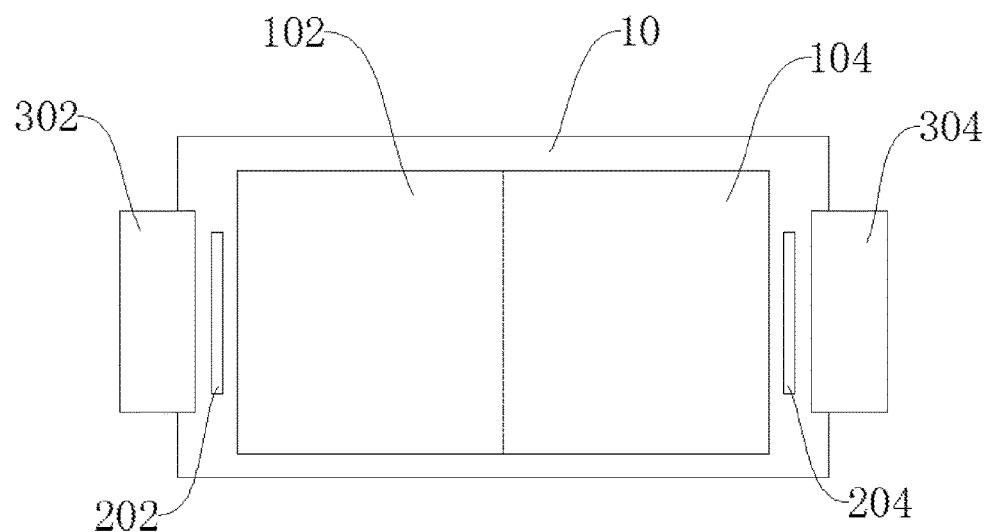
FIG. 1 is a structure top view diagram of a display module provided by the embodiment of the present application.

FIG. 1 is a structure top view diagram of a display module provided by the embodiment of the present application. As shown in figure, the display module comprises a flexible circuit board, a first drive chip 202, a second drive chip 204 and a display panel 10, and the first drive chip 202 and the second drive chip 204 are installed on the display panel 10. Specifically, the first drive chip 202 and the second drive chip 204 are symmetrically installed at two ends of the display panel 10, and both the first drive chip 202 and the second drive chip 204 are connected to the system main board through the flexible circuit board. A display region of the display panel 10 comprises a first display region 102 and a second display region 104 which are seamlessly connected. The first drive chip 202 is electrically connected to the first display region 102 and the second drive chip 204 is electrically connected to the second display region 104, and the system main board controls the first drive chip 202 and the second drive chip 204 respectively and correspondingly driving the first display region 102 and the second display region 104 to synchronously output images.

Specifically, the system main board sends an image signal and a first synchronization signal to the first drive chip 202, and the first drive chip 202 drives the first display region 102 to show a part of image content included in the image signal according to the first synchronization signal; the system main board sends the image signal and a second synchronization signal to the second drive chip 204, and the second drive chip 204 drives the second display region 104 to show the other part of image content included in the image signal according to the second synchronization signal, and the first synchronization signal and the second synchronization signal control the first display region 104 and the second display region 204 to synchronously show images. The first drive chip 202 and the second drive chip 204 respectively drive the first display region 102 and the second display region 104 to synchronously output images to reduce the loading of the single drive chip to solve the issue of faster charge signal decay and to promote the display result of the large scale display.

Figure 2:
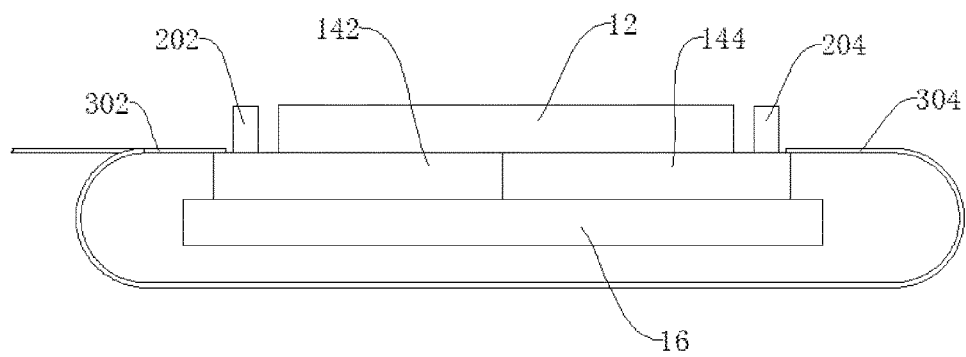
FIG. 2 is a structure side view diagram of a display module provided by the embodiment of the present application.

In this embodiment, with combination of FIG. 2, the display module comprises a color film substrate 12 and an array substrate 14 which are oppositely located, and a liquid crystal layer located between the color film substrate 12 and the array substrate 14. The display module adjusts the display images in the display region of the display panel 10 controlling the twist states of liquid crystal molecules of the liquid crystal layer and a working state of the array substrate 14. The array substrate 14 comprises a first part 142 and a second part 144 which are seamlessly connected, and the first part 142 and the color film substrate 12 are assembled and correspondingly form the first display region 102 of the display panel 10, and the second part 144 and the color film substrate 12 are assembled and correspondingly form the second display region 104 of the display panel 10. The first display region 102 and the second display region 104 are seamlessly connected and mutually stitched to form a complete display region. Either of the first display region 102 and the second display region 104 shows a part of the same complete image. The first display region 102 and the second display region 104 synchronously show images and meanwhile, the time of pixel charge is reduced by half. The working efficiency of the display module is promoted.

Specifically, the first drive chip 202 is installed at the edge of the first part 142, i.e. on the non display region of one end of the display panel 10. The second drive chip 204 is installed at the edge of the second part 144, i.e. on the non display region of the other end of the display panel 10. Furthermore, the inside of the display panel 10 comprises scan lines aligned in the column direction and data lines aligned in the row direction, and the first drive chip 202 is electrically connected to the data lines and the scan lines inside the first display region 102, and the first drive chip 202 controls the gate voltages of the scan lines inside the first display region 102, and thus the first display region 102 sequentially connects the Thin-film transistors (TFT) of each row, and the first drive chip 202 sequentially charges the respective Thin-film transistors; the second drive chip 204 is electrically connected to the data lines and the scan lines inside the second display region 104, and the second drive chip 204 controls the gate voltages of the scan lines inside the second display region 104, and thus the second drive chip 204 sequentially connects the Thin-film transistors of each row, and the second drive chip 204 sequentially charges the respective Thin-film transistors. The design that the first drive chip 202 and the second drive chip 204 synchronously drive the first display region 102 and the second display region 104 shortens the length of the data line of the complete display panel 10 to be half, and effectively reduces the decay of the type.

Figure 5:
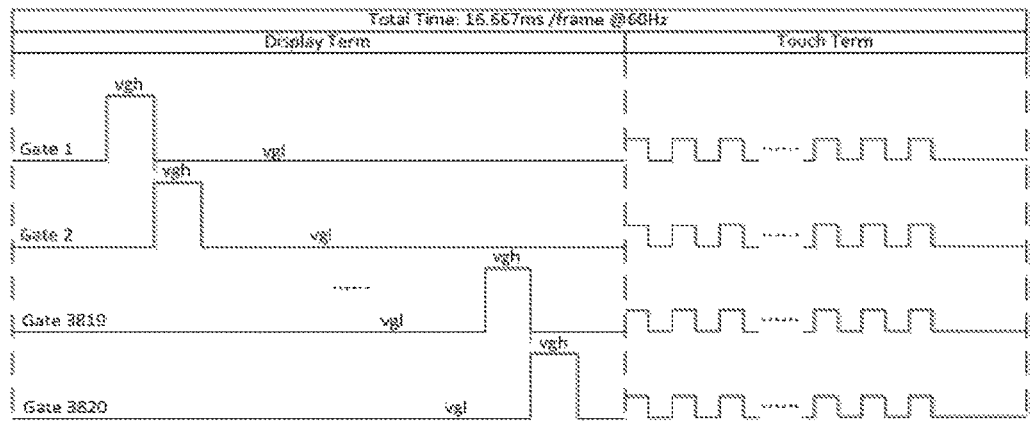
FIG. 5 is a charge signal pulse diagram of a regular liquid crystal display screen.
Figure 6:
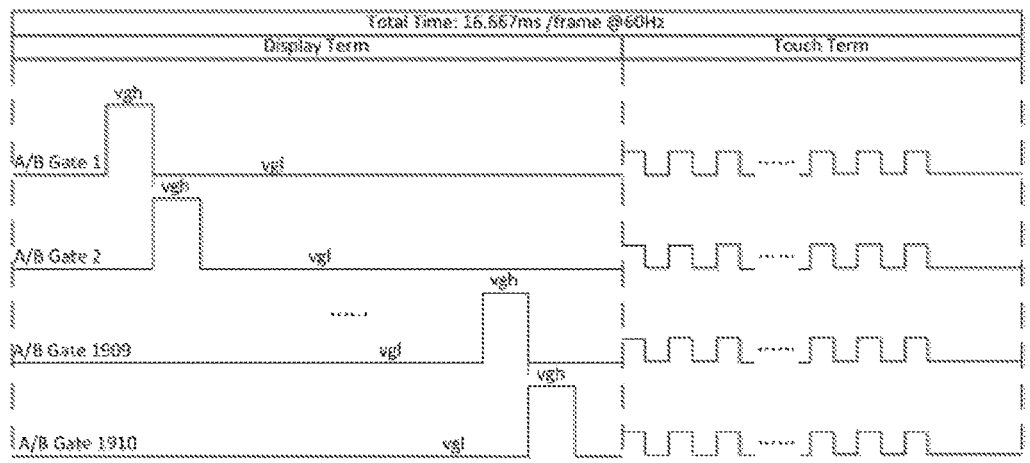
FIG. 6 is a charge signal pulse diagram of a liquid crystal display screen provided by the embodiment of the present application.

With combination of FIG. 5 and FIG. 6, the drive chip sends a high voltage level signal to the scan lines, i.e. to connect the thin film transistors of one line, and the drive chip applies the offset voltage to the pixel electrodes through the connected thin film transistors, i.e. to charge the pixel electrodes. For the display panel 10 of resolution 2160*3820, in one frame, there are thin film transistors of 3820 lines in total require to be connected for accepting the high voltage level signal in sequence. In the regular display module, one drive chip sequentially sends the high voltage level signal to the thin film transistors of each line. Namely, it needs to send 3820 high voltage level signals in the duration of one frame of image for achieving the necessary resolution. In figure, vgl represents a low voltage level signal. vgh represents a high voltage level signal. Gate1-Gate3820 represent the gate voltage curves of the first to the 3820th scan lines. A/B Gate1-A/B Gate1910 represent the gate voltages of the scan lines of the first display region 102/the second display region 104. Each wave peak of the gate voltage curve represents a high voltage level signal. The duration of one frame generally is 16.667 ms. The requirement of sending 3820 high voltage level signals make the loading of the drive chip larger. The working efficiency of the display panel 10 is lower, and the display result of the image is poor. In the display module provided by the present application, the first drive chip 202 and the second drive chip 204 work at the same time, and respectively send the high voltage level signal to the scan lines. The first drive chip 202 and the second drive chip 204 respectively control a part of thin film transistors. Moreover, the first drive chip 202 and the second drive chip 204 respectively drive the thin film transistors of 1910 lines. In the duration of one frame, the first drive chip 202 and the second drive chip 204 respectively send 1910 high voltage level signals. The loading of the single drive chip is reduced by half. The working efficiency of the display panel 10, and the display result of the image is better.

Figure 3:
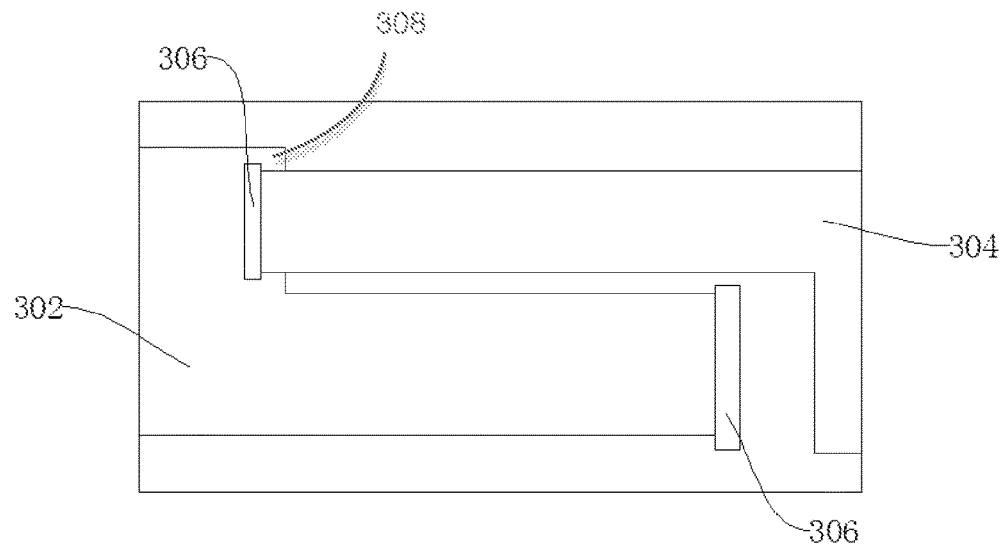
FIG. 3 is a structure rear view diagram of a display module provided by the embodiment of the present application.

In this embodiment, the flexible circuit board comprises a first flexible circuit board 302 and a second flexible circuit board 304, and an input end of the first flexible circuit board 302 is connected to the system main board, and an output end of the first flexible circuit board 302 is connected to the first part 142, and the first flexible circuit board 302 further comprises a branch end 308, as shown in FIG. 3, and an input end of the second flexible circuit board 304 is connected to the branch end 308, and an output end of the second flexible circuit board 304 is connected to the second part 144. In one embodiment, connectors 306 are connected either between the first flexible circuit board 302 and the second flexible circuit board 304 or between the first flexible circuit board 302 and the system main board. The system main board is respectively connected to the first drive chip 202 and the second drive chip 204 through the first flexible circuit board 302 and the second flexible circuit board 304. While the system main board send image signals to the first drive chip 202 and the second drive chip 204 to control the display panel 10 to show image content, it also sends the first synchronization signal and the second synchronization signal to the first drive chip 202 and the second drive chip 204 to respectively control the first drive chip 202 and the second drive chip 204 synchronously driving the first display region 102 and the second display region 104 to show images, and the common display image signal of the first display region 102 and the second display region 104 includes the complete image content. The first drive chip 202 and the second drive chip 204 respectively drive the first display region 102 and the second display region 104 synchronously output images. Namely, the first drive chip 202 and the second drive chip 204 are utilized to synchronously control the charge to the respective pixel electrodes to ensure the high resolution of the liquid crystal display, and meanwhile, the time of pixel charge is reduced by half, and the synchronous drive of the first drive chip 202 and the second drive chip 204 reduces the loading of the single drive chip to solve the issue of faster charge signal decay and to promote the display result of the large scale display.

In this embodiment, with combination of FIG. 3, the first flexible circuit board 302 is bent from an edge of the first part 142 to a side of a non display surface of the display panel 10, and the second flexible circuit board 304 is bent from an edge of the second part 144 to the side of the non display surface of the display panel 10. The display module further comprises a backlight module 16, and the backlight module 16 is located at the side of the non display surface of the display panel 10 and provides a backlight source to the display panel 10. The display panel 10 itself does not emit light but shows images with the backlight source provided by the backlight module 16 penetrating through the display panel 10. The first flexible circuit board 302 and the second flexible circuit board 304 are located at the side of the non display surface of the display panel 10 and bypass the backlight module 16, and do not shield the display panel 10 for showing images while not affecting the installation of the backlight module 16.

The present application further provides a liquid crystal display screen. The liquid crystal display screen comprises the aforesaid display module. The first drive chip 202 and the second drive chip 204 respectively drive the first display region 102 and the second display region 104 synchronously output images. Namely, the first drive chip 202 and the second drive chip 204 are utilized to synchronously control the charge to the respective pixel electrodes to ensure the high resolution of the liquid crystal display, and meanwhile, the time of pixel charge is reduced by half, and the synchronous drive of the first drive chip 202 and the second drive chip 204 reduces the loading of the single drive chip to solve the issue of faster charge signal decay and to promote the display result of the large scale display.

Figure 4:
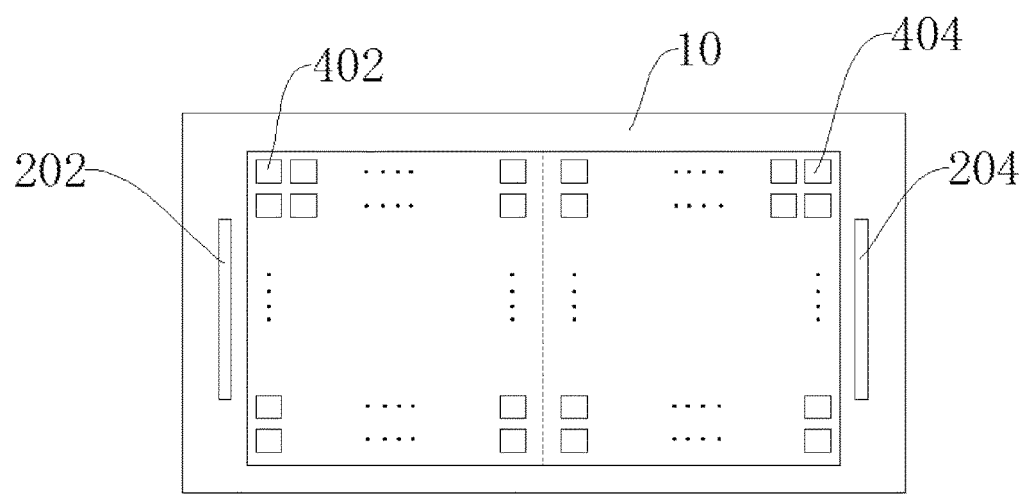
FIG. 4 is a structure top view diagram of a liquid crystal display screen provided by the embodiment of the present application.

FIG. 4 is a structure top view diagram of a liquid crystal display screen provided by the embodiment of the present application. As shown in figure, the liquid crystal display screen further comprises a sensing unit, and the sensing unit is embedded in a liquid crystal display pixel unit of the display panel 10 and employed to receive an electrical signal generated due to that a user touches the liquid crystal display screen. Specifically, the sensing unit is a sensing unit that is manufactured with tin indium oxide (ITO) glass ITO thin film material combining the design requirement of the product structure and the touch control chip. The sensing unit is electrically connected to the touch control chip. The touch control chip converts the analog signal generated by that the operator touches the liquid crystal display screen into the digital signal, and sends the same to the system main board for analysis. The method that the liquid crystal pixel unit is embedded with the sensing unit (In-cell technology) makes the liquid crystal display screen possess the touch control function, and remains the light, thin properties of the liquid crystal display screen at the same time.

In this embodiment, the sensing unit comprises a plurality of first sensing units 402 and a plurality of second sensing units 404, and the first sensing units 402 are in array arrangement in the first display region 102, and the second sensing units 404 are in array arrangement in the second display region 104. The first drive chip 202 is electrically connected to the first sensing units 402 and processes an electrical signal transmitted by the first sensing unit 402, and the second drive chip 204 is electrically connected to the second sensing units 404 and processes an electrical signal transmitted by the second sensing unit 404. The first sensing units 402 and the second sensing unit 404 independently work. Both the first drive chip 202 and the second drive chip 204 integrate the touch control chip function. The first drive chip 202 and the second drive chip 204 respectively process the signals of the first sensing units 402 and the second sensing unit 404 to reduce the loading of the single touch control chip. For the large scale liquid crystal display screen of high resolution, multiple pixel units, the precision of touch control and the signal process speed are promoted. With combination of FIG. 5 and FIG. 6, for the liquid crystal display screen of resolution 2160*3820, the required duration of charging the pixel electrodes of each lines is set to be T, and then the regular liquid crystal display screen needs 3820T for accomplishing the charge to all the pixels, i.e. in one frame of image, 3820T is required for showing image; in the liquid crystal display screen of the present application, the first drive chip 202 and the second drive chip 204 respectively drive the pixels of the first display region 102 and the second display region 104 to be synchronously charged. The first display region 102 and the second display region 104 respectively comprise 1910 rows of pixel electrodes. In 1910T, the charge to all the pixel electrodes of the first display region 102 and the second display region 104 can be accomplished, i.e. in one frame, the duration for showing the complete image is 1910T. Because the duration of one frame of image is fixed (16.667 ms), the occupied duration of showing image decreases, the more working duration can be preserved for the touch control chip.

The first drive chip 202 and the second drive chip 204 respectively drive the first display region 102 and the second display region 104 synchronously output images. Namely, the first drive chip 202 and the second drive chip 204 are utilized to synchronously control the charge to the respective pixel electrodes to ensure the high resolution of the liquid crystal display, and meanwhile, the time of pixel charge is reduced by half, and the synchronous drive of the first drive chip 202 and the second drive chip 204 reduces the loading of the single drive chip to solve the issue of faster charge signal decay and to promote the display result of the large scale display.

The foregoing descriptions are merely the specific embodiments of the present application. However, the present application is not limited thereby. Any modifications, equivalent replacements or improvements within the spirit and principles of the embodiment described above, which can be easily derived by those skilled persons in this art from the technical field disclosed in the present application should be covered by the protected scope of the application. Thus, the patent protection scope of the present application should be subjected to what is claimed is.

What is claimed is:
1. A display module comprising a flexible circuit board, a first drive chip, a second drive chip, and a display panel, wherein the display panel comprises a first display region and a second display region which are seamlessly connected, the first drive chip and the second drive chip are installed on the display panel, the flexible circuit board is electrically connected to a system main board, the first drive chip and the second drive chip, the system main board sends an image signal and a first synchronization signal to the first drive chip, the first drive chip drives the first display region to show a part of image content included in the image signal according to the first synchronization signal, the system main board sends the image signal and a second synchronization signal to the second drive chip, the second drive chip drives the second display region to show the other part of image content included in the image signal according to the second synchronization signal, and the first synchronization signal and the second synchronization signal control the first display region and the second display region to synchronously show images;
wherein the display module comprises a color film substrate and an array substrate which are oppositely located, and the array substrate comprises a first part and a second part which are seamlessly connected, and the first part and the color film substrate are assembled and correspondingly form the first display region, and the second part and the color film substrate are assembled and correspondingly form the second display region;

wherein the first drive chip is installed on the first part and electrically connected to a data line and a scan line corresponding to the first display region, and the second drive chip is installed on the second part and electrically connected to the data line and the scan line corresponding to the second display region; and wherein the flexible circuit board comprises a first flexible circuit board and a second flexible circuit board, and an input end and an output end of the first flexible circuit board are respectively connected to the system main board and the first part, and the first flexible circuit board further comprises a branch end, and an input end and an output end of the second flexible circuit board are respectively connected to the branch end and the second part.

2. The display module according to claim 1, wherein the first flexible circuit board is bent from an edge of the first part to a side of a non-display surface of the display panel, and the second flexible circuit board is bent from an edge of the second part to the side of the non-display surface of the display panel.

3. The display module according to claim 2, wherein the display module further comprises a backlight module, and the backlight module is located at the side of the non-display surface of the display panel and provides a backlight source to the display panel.

4. A liquid crystal display screen comprising a display module, wherein the display module comprises a flexible circuit board, a first drive chip, a second drive chip, and a display panel, the display panel comprises a first display region and a second display region which are seamlessly connected, the first drive chip and the second drive chip are installed on the display panel, the flexible circuit board is electrically connected to a system main board, the first drive chip and the second drive chip, the system main board sends an image signal and a first synchronization signal to the first drive chip, the first drive chip drives the first display region to show a part of image content included in the image signal according to the first synchronization signal, the system main board sends the image signal and a second synchronization signal to the second drive chip, the second drive chip drives the second display region to show the other part of image content included in the image signal according to the second synchronization signal, and the first synchronization signal and the second synchronization signal control the first display region and the second display region to synchronously show images;

wherein the display module comprises a color film substrate and an array substrate which are oppositely located, and the array substrate comprises a first part and a second part which are seamlessly connected, and the first part and the color film substrate are assembled and correspondingly form the first display region, and the second part and the color film substrate are assembled and correspondingly form the second display region;

wherein the first drive chip is installed on the first part and electrically connected to a data line and a scan line corresponding to the first display region, and the second drive chip is installed on the second part and electrically connected to the data line and the scan line corresponding to the second display region; and wherein the flexible circuit board comprises a first flexible circuit board and a second flexible circuit board, and an input end and an output end of the first flexible circuit board are respectively connected to the system main board and the first part, and the first flexible circuit board further comprises a branch end, and an input end and an output end of the second flexible circuit board are respectively connected to the branch end and the second part.

5. The liquid crystal display screen according to claim 4, wherein the first flexible circuit board is bent from an edge of the first part to a side of a non-display surface of the display panel, and the second flexible circuit board is bent from an edge of the second part to the side of the non-display surface of the display panel.

6. The liquid crystal display screen according to claim 5, wherein the display module further comprises a backlight module, and the backlight module is located at the side of the non-display surface of the display panel and provides a backlight source to the display panel.

7. The liquid crystal display screen according to claim 4, wherein the liquid crystal display screen further comprises a sensing unit, and the sensing unit is embedded in a liquid crystal display pixel unit of the display panel and employed to receive an electrical signal generated due to that a user touches the liquid crystal display screen.

8. The liquid crystal display screen according to claim 7, wherein the sensing unit comprises a plurality of first sensing units and a plurality of second sensing units, and the first sensing units are in array arrangement in the first display region, and the second sensing units are in array arrangement in the second display region.

9. The liquid crystal display screen according to claim 8, wherein the first drive chip is electrically connected to the first sensing units and processes the electrical signal transmitted by the first sensing unit, and the second drive chip is electrically connected to the second sensing units and processes the electrical signal transmitted by the second sensing unit.

* * * * *